United States Patent
Chen et al.

(10) Patent No.: US 7,949,509 B2
(45) Date of Patent: May 24, 2011

(54) METHOD AND TOOL FOR GENERATING SIMULATION CASE FOR IC DEVICE

(75) Inventors: Cheng-Hao Chen, Taipei (TW); Jo-Chieh Ma, Taipei (TW)

(73) Assignee: Via Technologies, Inc., Taipei (TW)

( * ) Notice: Subject to any disclaimer, the term of this patent is extended or adjusted under 35 U.S.C. 154(b) by 512 days.

(21) Appl. No.: 11/935,138

(22) Filed: Nov. 5, 2007

(65) Prior Publication Data

US 2008/0189095 A1    Aug. 7, 2008

(30) Foreign Application Priority Data

Feb. 1, 2007    (TW) ................................ 96103770 A

(51) Int. Cl.
     *G06F 17/50*    (2006.01)
(52) U.S. Cl. ............ 703/14; 714/724; 714/741; 716/111
(58) Field of Classification Search .................... 703/14, 703/13; 714/741, 724, 728, 733, 739; 702/185; 716/5, 6, 111
See application file for complete search history.

(56) References Cited

U.S. PATENT DOCUMENTS

| | | | |
|---|---|---|---|
| 5,604,895 A * | 2/1997 | Raimi | 703/13 |
| 6,775,798 B2 * | 8/2004 | Watkins | 714/733 |
| 7,117,186 B2 * | 10/2006 | Koza et al. | 706/13 |
| 2002/0073375 A1 * | 6/2002 | Hollander | 714/739 |
| 2003/0093764 A1 * | 5/2003 | Devins et al. | 716/5 |
| 2005/0086565 A1 * | 4/2005 | Thompson et al. | 714/741 |
| 2005/0166116 A1 * | 7/2005 | Ramsey | 714/741 |
| 2006/0107141 A1 * | 5/2006 | Hekmatpour | 714/724 |
| 2006/0111873 A1 * | 5/2006 | Huang et al. | 702/185 |
| 2007/0192753 A1 * | 8/2007 | Lam et al. | 716/5 |
| 2007/0220386 A1 * | 9/2007 | Craig et al. | 714/728 |
| 2008/0104556 A1 * | 5/2008 | Yamada | 716/5 |

FOREIGN PATENT DOCUMENTS

| | | |
|---|---|---|
| CN | 1666202 A | 9/2005 |
| WO | 03/091914 A1 | 11/2003 |

* cited by examiner

*Primary Examiner* — Kandasamy Thangavelu
(74) *Attorney, Agent, or Firm* — Kirton & McConkie; Evan R. Witt

(57) ABSTRACT

For generating a simulation case to verify an operation of an IC device, a database including a plurality of device description files, a plurality of pattern files and a plurality of command files is established. Files stored in the database and corresponding to an IC device are collected. The collected files are parsed to find out entries to be edited. Specified entries are edited by a user according to the operation of the IC device. A simulation case or a plurality of simulation cases are generated according to the entries.

15 Claims, 7 Drawing Sheets

METHOD AND TOOL FOR GENERATING SIMULATION CASE FOR IC DEVICE

BACKGROUND OF THE INVENTION

1. Field of the Invention

The present invention relates to a method and a tool to simulate the behavior of an IC device, and more particularly, to a method and a tool for generating a simulation case for an IC device.

2. Description of Related Art

Referring to FIG. 1, a flowchart illustrating a conventional method for developing an IC device is shown. The method includes Project Initialization Phase 11, Software Plan Phase 13, Design Phase 15, Validation 17 and Mass Production 19. During Design Phase 15, the designer simulates the behavior of the hardware he designed to verity if the logic within the hardware acts as he wants it to be. There are many software programs conventionally used to simulate the operation of complex IC devices for verification of logical correctness. Moreover, during the Validation phase 17, emulation is performed to set-up the environment where the IC devices are applied for verifying the correctness of the whole electronic system. In general, the simulation case is composed of machine-readable commands in sequence defined in a simulation tool to perform the actual actions of the IC devices, such as writing data, reading data or other actions. Thus, the IC designer must use a special simulation tool in the simulation process and the emulation process during Software Plan Phase 13 under a specified specification of hardware architecture.

Conventionally, designers of different or even the same IC devices may independently create their own formats of simulation cases according to respective hardware architectures and design concepts, which is adverse to integration of technologies and leads to waste of resources.

Therefore, an object of the present invention is to solve the problem of redundant work and improve design efficiency.

SUMMARY OF THE INVENTION

The present invention relates to a method and a tool for generating a simulation case corresponding to an IC device. The method includes steps of: collecting a plurality of device description files corresponding to the IC device from a database; parsing the collected files to find out an entry or a plurality of entries to be edited; editing the entry or entries according to the operation of the IC device; generating the simulation case according to the collected files and the edited entry or entries.

The present invention is also to disclose a tool for generating a simulation case for an IC device, the tool includes a collecting unit for collecting files corresponding to an IC device from a database, wherein the collected files include one or more device description files; a parsing unit connecting to the collecting unit for parsing the collected files to find out an entry or a plurality of entries to be edited; an editing unit connecting to the parsing unit for editing the entry or entries according to the operation of the IC device; and an operating unit having the collector collect the files and presenting the collected files as the simulation case.

BRIEF DESCRIPTION OF THE DRAWINGS

The present invention may best be understood through the following description with reference to the accompanying drawings, in which.

DETAILED DESCRIPTION OF PREFERRED EMBODIMENTS

Figure 1:
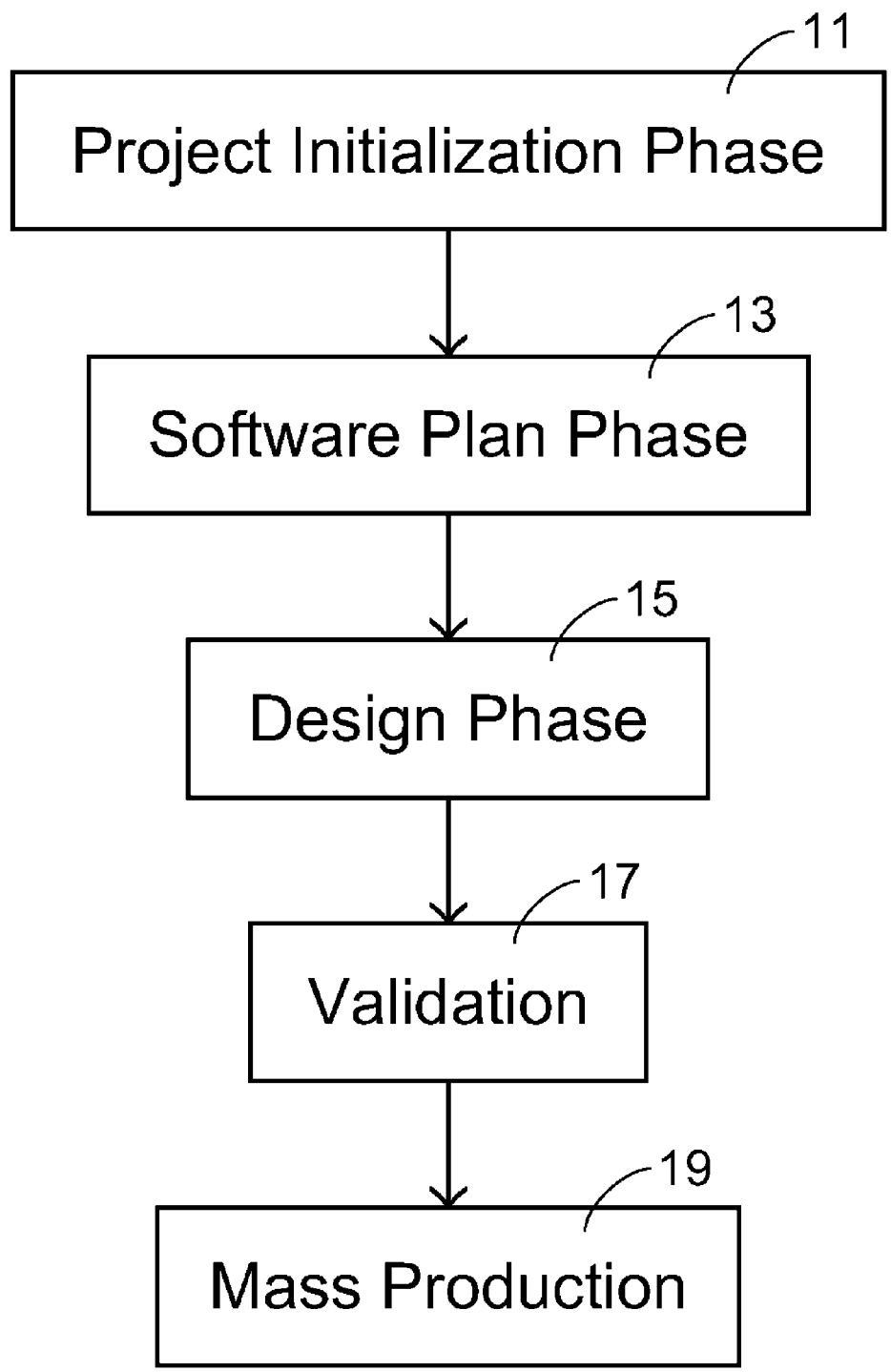
FIG. 1 is a flowchart of a conventional method for developing an IC device.
Figure 2:
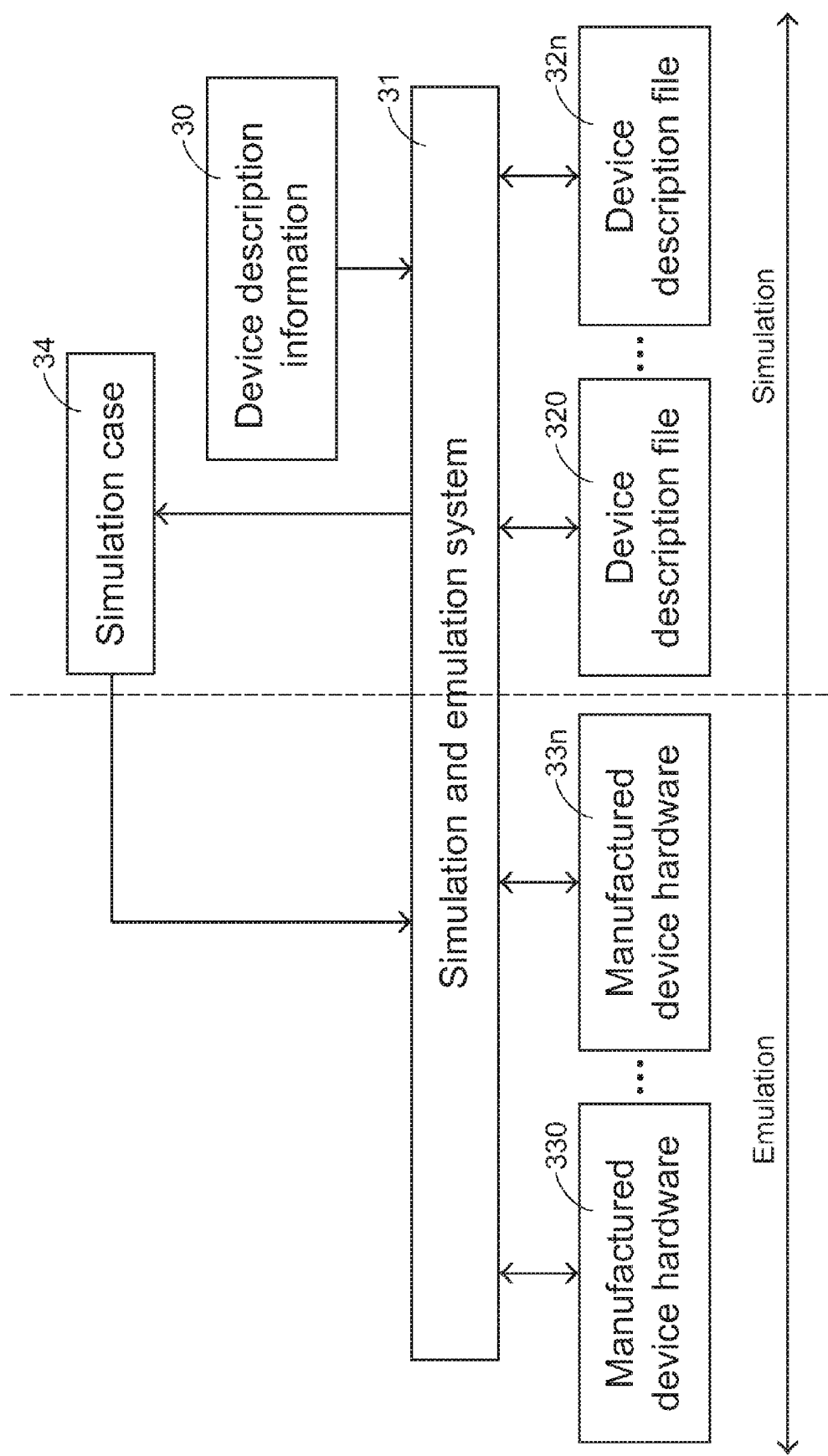
FIG. 2 is a functional block diagram of an embodiment of a simulation and emulation system according to the present invention.

Referring to FIG. 2, a functional block diagram of an embodiment of a simulation and emulation system according to the present invention is shown. The simulation and emulation system 31 organizes device description information (DDI) 30 and generates device description files 320~32$n$ accordingly, which are thus identifiable by the simulation and emulation system 31. The device description files 320~32$n$ define necessary information for a hardware configuration for simulation and emulation. For example, the device description files 320~32$n$ include the type, the size and the address of a register in an IC device and the settings for the register, which correspond to the specification of the hardware design. According to the inputted device description information 30 of the IC device, the simulation and emulation system 31 generates the device description files 320~32$n$ corresponding to the IC devices and stores them in a database. Afterwards, when a simulation/emulation task is to be performed, a user may utilize the same simulation and emulation system 31 to retrieve one or more of the device description files and input descriptions through a user interface provided by the simulation and emulation system 31. For example, the user fills a proper value into the device register to indicate a specific operation of the IC device, such as a reading or writing command. Then, the simulation and emulation system 31 generates one or more simulation cases 34 corresponding to the specific operation of the IC device. The generated simulation case(s) is(are) then provided for the simulation of a design logic generated in the device design flow and for the emulation of the manufactured device hardware 330-33$n$.

For example, a simulation case of an elementary device such as a PCI device or a USB device can be built up in advance. That is, the user inputs device description information of a PCI device and device description information of a USB device so that the simulation and emulation system organizes the device description information (DDI) to generate a device description file of the PCI device and a device description file of the USB device, respectively. Thereafter, when a user is designing an IC device including the elementary device, e.g. a PCI device, the device description file of the PCI device, which has been established previously and identifiable by the simulation and emulation system, can be retrieved by the simulation and emulation system and described through the user interface. Thereby, a simulation case corresponding to the IC device is generated and provided for the simulation of the design logic generated in the PCI device design flow and for the emulation of the manufactured device. In this way, a user can use the device description file which has been established previously for a new design and needs only modifying instead of creating.

Figure 3:
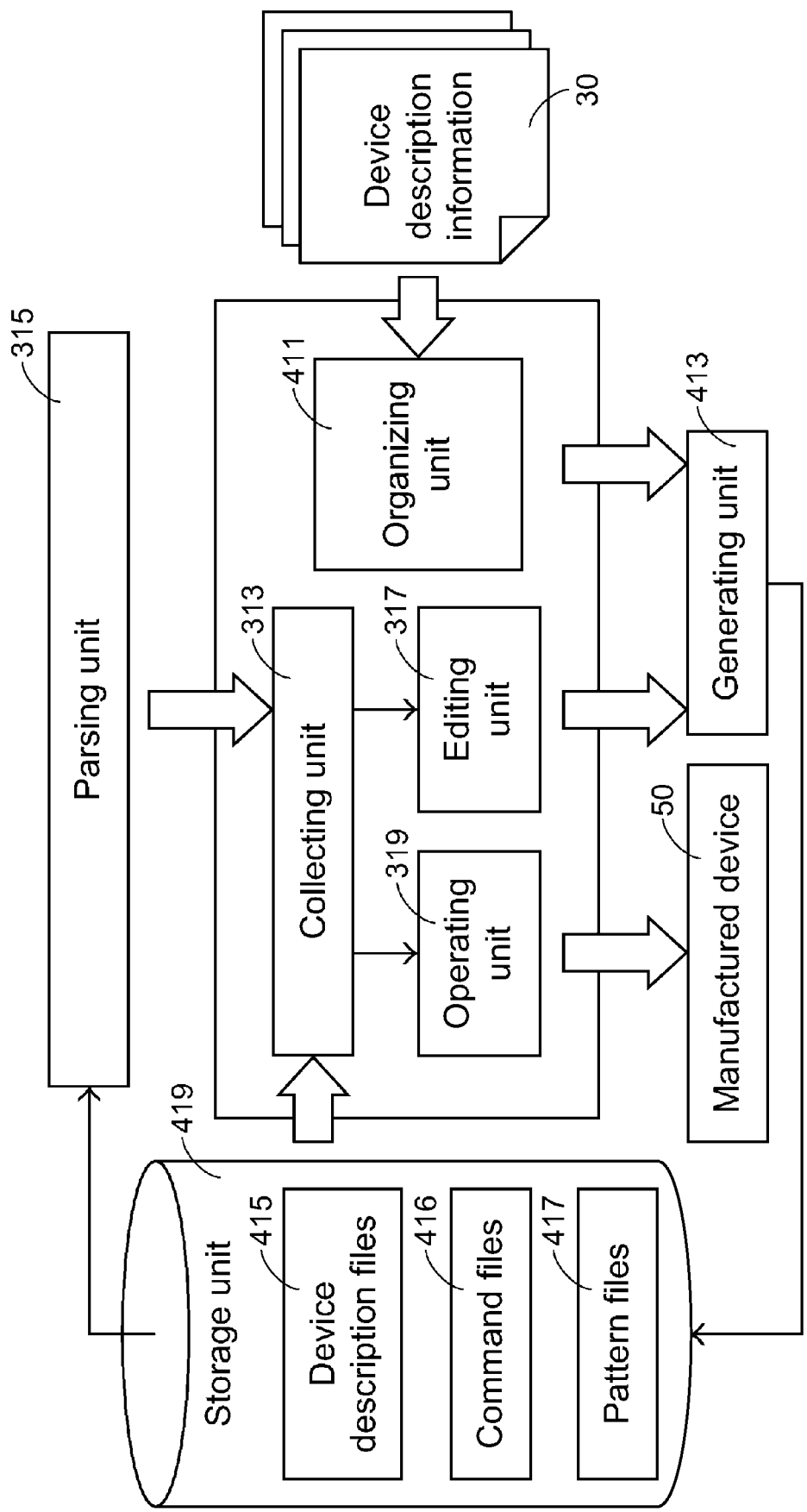
FIG. 3 is a block diagram illustrating details of the simulation and emulation system of FIG. 2.

Referring further to FIG. 3, a block diagram illustrating the details of the simulation and emulation system according to an embodiment of the present invention is shown. The simulation and emulation system includes a collecting unit 313, a parsing unit 315, an editing unit 317, an operating unit 319, an organizing unit 411 and a generating unit 413. By way of the organizing unit 411, a user interface is provided for a user to input device description information which describes the necessary information of an IC device to the simulation and emulation tool. The information, for example, includes the size and the address of a register in the device, the settings for the register and other information. The user may input the device description information according to the hardware specification of the IC device through the user interface. Then the organizing unit 411 transmits the IC device description information to the generating unit 413, and the generating unit 413, generates one or more description files according to the IC device description information and stores the description files into the storage unit 419 which can be a hard disk or a memory. The above process is repeated when designing different IC devices, and meanwhile a number of description files corresponding to a variety of IC devices are stored in a database. Through the collection and management of the collecting unit 313, the generated device description files in the database are highly identifiable and searchable. In this way, the above-mentioned device description files 320-32n are obtained.

Afterwards, when a user needs to create a simulation case for verifying a specific operation of a designed IC device, the collecting unit 313 searches the database for one of the device description files 415, which matches the specification of the IC device in the design according to the user's command. The parsing unit 315 then parses the information of the selected device description file and finds out entries to be edited. Then the editing unit 317 generates a user interface for a user to edit the entries according to the operation of the IC device. For example, the user fills a proper value into a device register of the IC device to indicate a specific operation of the IC device, such as a reading or writing command. Then, the generating unit 413 generates a command file according to the edited entries. The command file is stored into the storage unit 419 and listed in the database as well as the device description files 415 and other command files 416. For commands common to various IC devices, they can be particularly defined via the user interface of the editing unit 317, generated by the generating unit 413, and stored into the storage unit 419 as pattern files 417. As a result, for subsequent IC design involving similar architectures, the pattern files 417 can be used so as to simplify the editing process.

When a simulation/emulation process is to be performed, the operating unit 319 utilizes the collecting unit 313 to collect files corresponding to the designed IC device from the device description files 415, the pattern files 417 and the command files 416 stored in the storage unit 419 and present the collected command files and the collected pattern files as a simulation case, and then the operating unit 319 lists the simulation case in a collectable menu. After that, the user may select one or more simulation cases from the collectable menu according to the specific operation of the IC device. Then the operating unit 319 executes the simulation process and/or the emulation process of the manufactured device 50 according to the selected simulation case(s).

Figure 4:
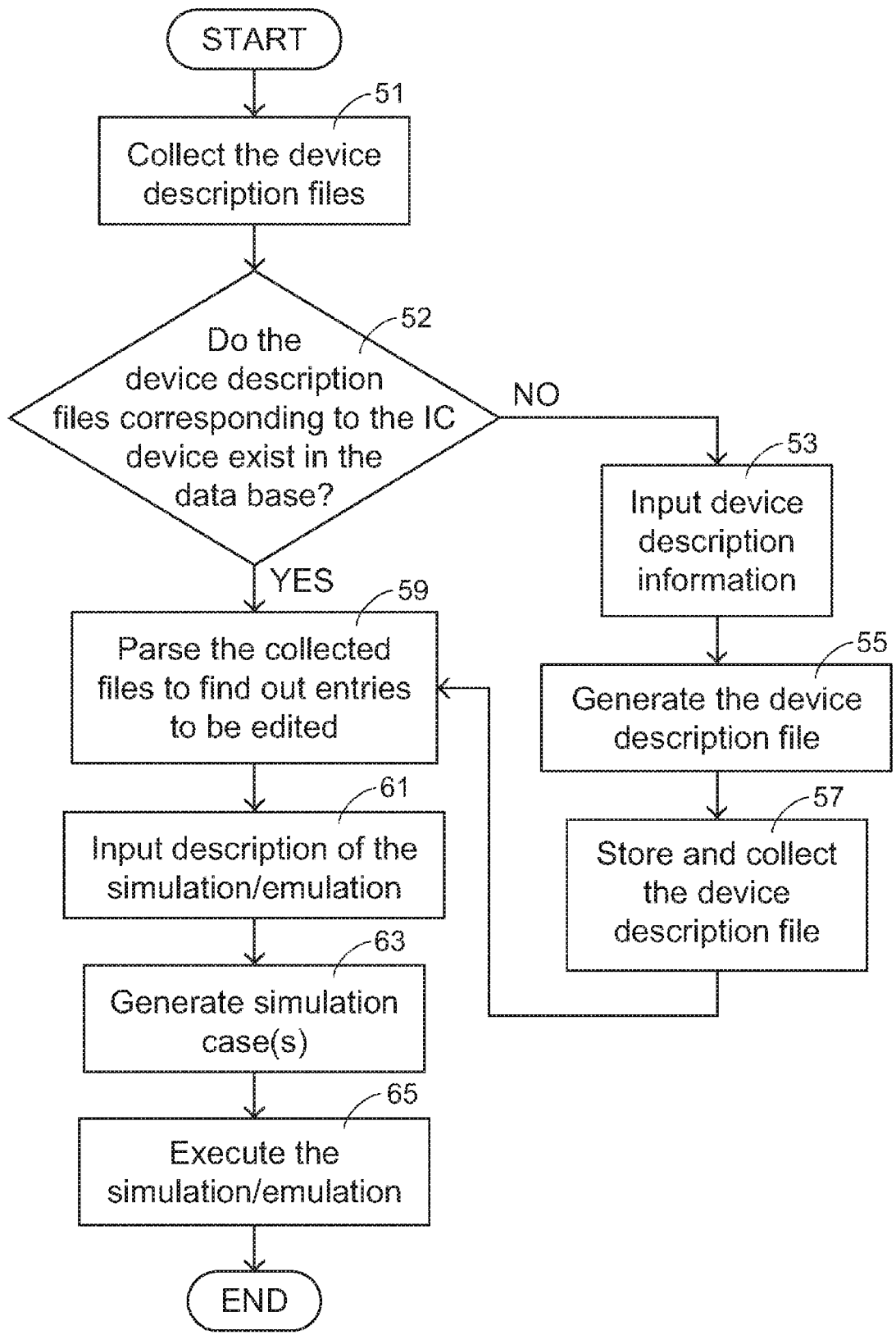
FIG. 4 is a flowchart illustrating an embodiment of a method for generating a simulation case and executing a simulation/emulation process according to the present invention.

Referring to FIG. 4, an embodiment of a method for generating a simulation case and executing a simulation/emulation process according to the present invention is shown. Firstly in step 51, the collecting unit collects the device description files which define necessary information of the hardware specification of a designed IC device for simulation and emulation. Then in Step 52, the collecting unit determines whether the device description files corresponding to the designed IC device exist in the storage unit. If there is no device description file corresponding to the designed IC device existing in the storage unit, the user is requested to input device description information corresponding to the IC device through the user interface (Step 53). Then the generating unit generates the device description files in response to the device description information in Step 55, and stores the device description files in the storage unit in step 57. On the other hand, when the device description files corresponding to the desired IC device are located in the storage unit, the parsing unit parses the device description files read from the storage unit in Step 59. At this time, the information of the simulation and emulation is unclear, so the user uses the user interface to further describe the operation of the IC device in Step 61. Afterwards, one or more simulation cases are generated according to the collected device description files and the described operation of the IC device (Step 63). Finally in Step 65, the simulation/emulation process is executed according to the generated simulation cases.

Figure 5:
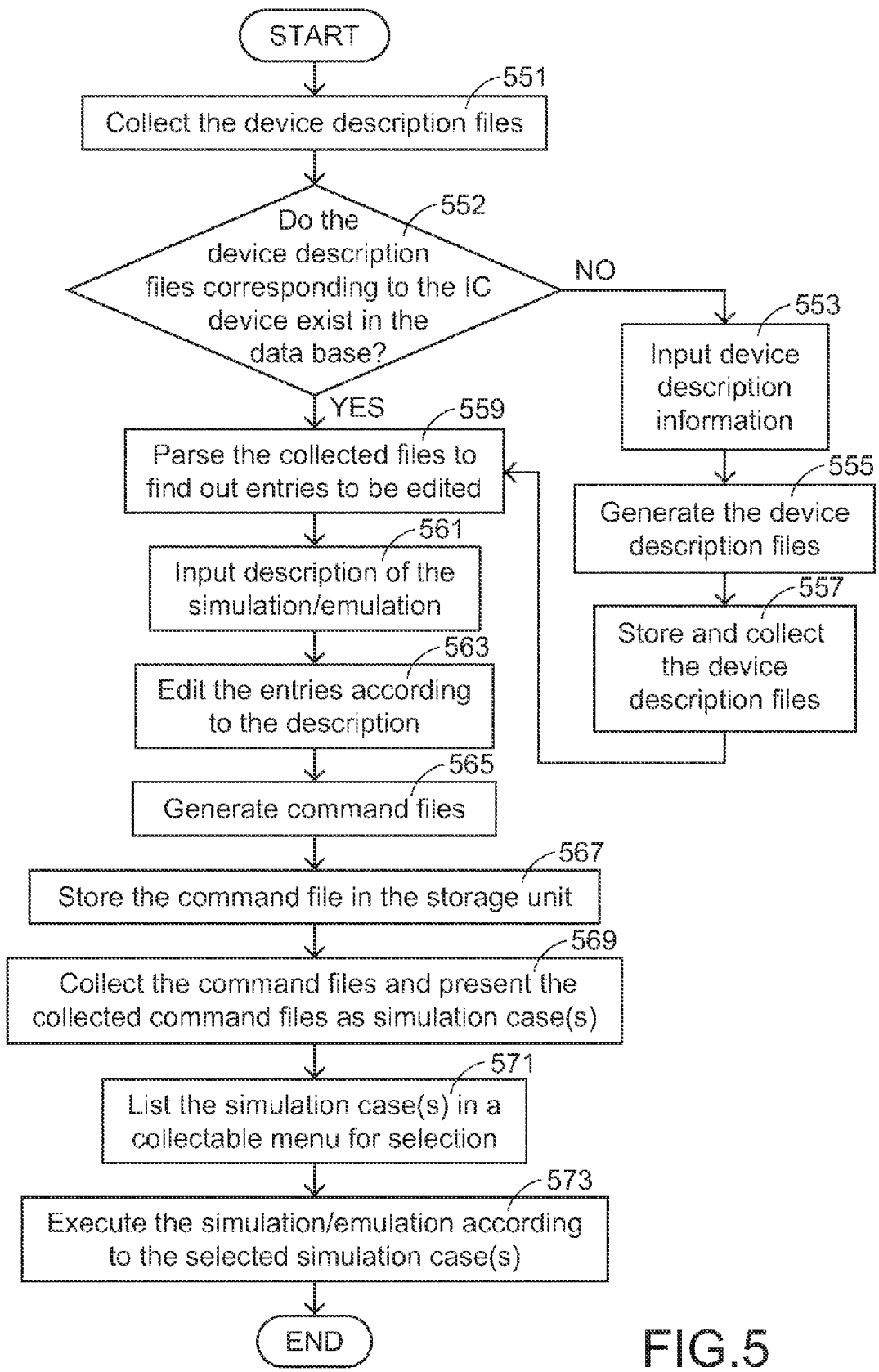
FIG. 5 is a flowchart illustrating another embodiment of a method for generating a simulation case and executing a simulation/emulation process according to the present invention.

Referring to FIG. 5, another embodiment of a method for generating a simulation case and executing a simulation/emulation process is shown. Firstly, the collecting unit collects the device description files corresponding to a designed IC device in Step 551. Then in Step 552, the collecting unit determines whether the device description files corresponding to the designed IC device exist in the storage unit. If there is no such device description file existing in the storage unit, the user is requested to input device description information of the designed IC device (Step 553). Then the generating unit generates the device description file in Step 555 and stores the device description file in the storage unit in Step 557. Afterwards, the parsing unit parses the device description files read from the storage unit to find out entries to be edited in Step 559. In step 561, the user inputs the operation of the IC device describing the simulation/emulation process. After the information of the simulation/emulation process is inputted, the editing unit edits the entries (Step 563). Then the generating unit generates command files according to the operation of the IC device in Step 565 and stores the command files in the storage unit in Step 567. In Step 569, the operating unit uses the collecting unit to collect the existing command files and presents the collected command files as one or more simulation cases. Then, the generated simulation cases will be listed in a collectable menu and the user may select one or more simulation cases from the collectable menu according to the specific operation of the IC device (Step 571). Finally, the operating unit executes the simulation/emulation process according to the selected simulation cases in Step 573.

Figure 6A:
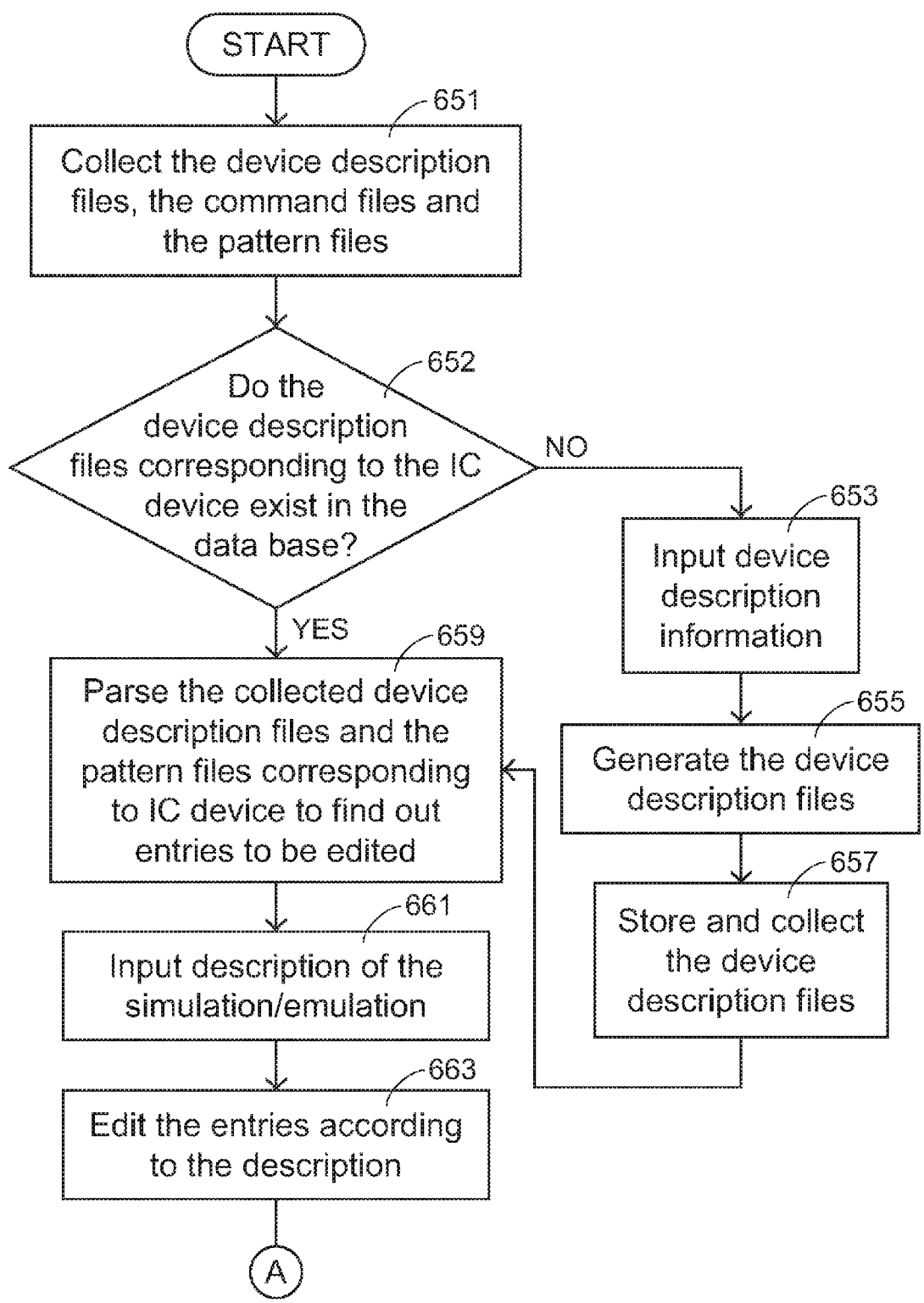
FIGS. 6A and 6B are flowcharts illustrating a further embodiment of a method for generating a simulation case and executing a simulation/emulation process according to the present invention.
Figure 6B:
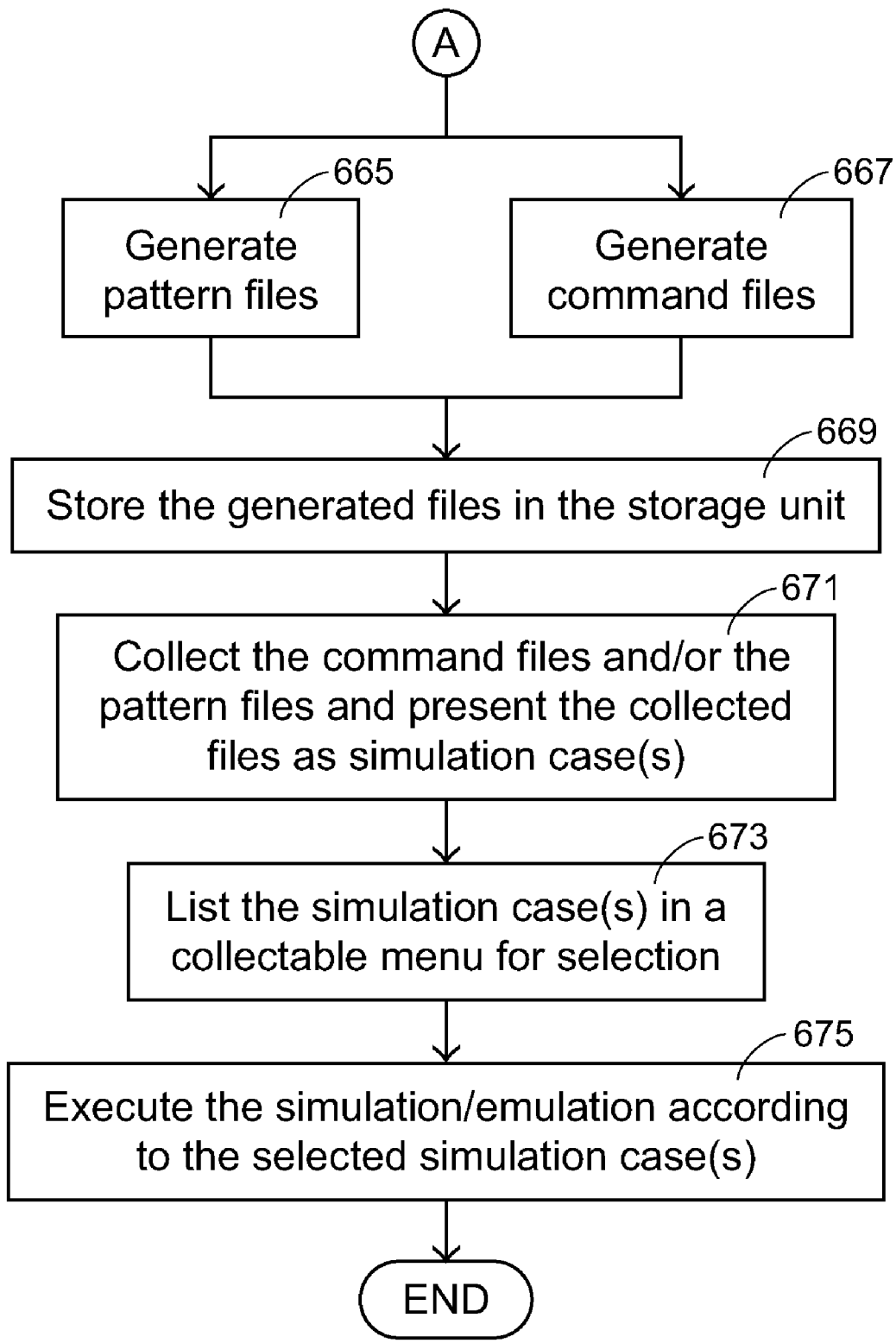

FIG. 6A and FIG. 6B illustrate a further embodiment of a method for generating a simulation case and executing a simulation/emulation process according to the present invention. Firstly, in Step 651, the collecting unit collects the device description files, the command files and the pattern files corresponding to a designed IC device. In general, the pattern files contain the description of the simulation and emulation which can also be used in other architectures for simulation/emulation. Then in Step 652, the collecting unit determines whether the device description files corresponding to the designed IC device exist in the storage unit. If there is no such device description file existing in the storage unit, the user is requested to input the device description information in Step 653. Then the generating unit generates the device description files in response to the device description information in Step 655 and stores the device description files in the storage unit (Step 657). In step 659, the parsing unit parses the collected device description files and the collected pattern files to find out entries to be edited. In step 661, the user inputs the operation of the IC device. Afterwards, the editing unit edits the entries according to the operation of the IC device to obtain simulation cases (Step 663). If the input operation of the IC device can be used by other designs, the generating unit generates the commands associated with the operation of the IC device as pattern files (Step 665) and stores the pattern files in the storage unit (Step 669). On the other hand, if the input operation of the IC device can not be used by other designs, the generating unit generates the commands associated with the operation of the IC device as command files (Step 667) and stores the command files in the storage unit (Step 669). In other words, a database is established by the generated device description files, the generated command files and the generated pattern files. In Step 671, the operating unit has the collecting unit collect the existing command files and/or pattern files, and presents the collected command files and pattern files as one or more simulation cases. Then, the generated simulation cases are listed in a collectable menu and the user may select one or more simulation cases from the collectable menu according to the specific operation of the IC device in Step 673. Finally in Step 675, the operating unit executes the simulation/emulation process according to the selected simulation cases.

As previously described, the present invention can solve the problems the traditional method encountered and achieve the objectives of the invention. Those skilled in the art may make various changes in the embodiments without departing from the spirit and scope of the invention.

The invention claimed is:

1. A method for generating a simulation case to verify an operation of an IC device, implemented by a computer system and comprising steps of:
    collecting a plurality of device description files corresponding to respective devices to be included in the IC device from a database;
    parsing the collected files to find out an entry or a plurality of entries to be edited;
    editing the entry or entries according to a description of the operation of the IC device;
    identifying commands that are common with other ICs, editing the commands and generating a pattern file that comprises the common commands according to the description of the operation of the IC device in the edited file; and
    generating the simulation case according to the collected files and the edited entry or entries based on the generated pattern file.

2. The method of claim 1 further comprising a step of generating a new device description file corresponding to an additional device to be included in the IC device if there is no device description file corresponding to the additional device found in the database.

3. The method of claim 2 further comprising a step of storing the new device description file in the database.

4. The method of claim 1 wherein the step of generating the simulation case includes generating a command file according to the description of the operation of the IC device.

5. The method of claim 4 further comprising a step of storing the command file in the database.

6. The method of claim 1 further comprising a step of storing the pattern file in the database.

7. The method of claim 1 wherein the step of generating the simulation case includes collecting and presenting a plurality of command files and/or a plurality of pattern files corresponding to the description of the operation of the IC device from the database.

8. The method of claim 1 further comprising a step of listing the simulation case in a collectable menu for a user to select.

9. The method of claim 8 further comprising a step of executing a simulation process or an emulation process according to the selected simulation case.

10. A tool for generating a simulation case to verify an operation of an IC device, the tool comprising:
    a collecting unit for collecting files corresponding to an IC device from a database, wherein the collected files include one or more device description files associated with respective devices to be included in the IC device;
    a parsing unit connecting to the collecting unit for parsing the collected device description files to find out an entry or a plurality of entries to be edited;
    an editing unit connecting to the parsing unit for editing the entry or entries according to the description of the operation of the IC device;
    a generating unit for generating one or more command files and one or more pattern files according to the edited entry or entries from the editing unit, wherein the pattern files are generated by including commands that are common with other ICs; and
    an operating unit having the collecting unit collect the one or more command files and the one or more pattern files and presenting the collected one or more command files and one or more pattern files as the simulation case.

11. The tool of claim 10 further comprising a storage unit for storing the database.

12. The tool of claim 10 further comprising an organizing unit for receiving a device description information corresponding to an additional device to be included in the IC device.

13. The tool of claim 12 further comprising a generating unit in communication with the organizing unit for generating a new device description file according to the device description information.

14. The tool of claim 10 wherein the operating unit further lists the simulation case in a collectable menu for a user to select.

15. The tool of claim 14 wherein the operating unit further executes a simulation process or an emulation process according to the selected simulation case.

* * * * *